United States Patent
Auerbach et al.

(10) Patent No.: US 6,633,064 B2
(45) Date of Patent: Oct. 14, 2003

(54) COMPENSATION COMPONENT WITH IMPROVED ROBUSTNESS

(75) Inventors: Franz Auerbach, München (DE); Gerald Deboy, München (DE); Hans Weber, Villach (AT)

(73) Assignee: Infineon Technologoes AG, Munich (DE)

( * ) Notice: Subject to any disclaimer, the term of this patent is extended or adjusted under 35 U.S.C. 154(b) by 0 days.

(21) Appl. No.: 09/861,428

(22) Filed: May 18, 2001

(65) Prior Publication Data

US 2002/0060344 A1 May 23, 2002

(30) Foreign Application Priority Data

May 18, 2000 (DE) .......................... 100 24 480

(51) Int. Cl.$^7$ .................. H01L 29/76; H01L 29/94; H01L 31/062; H01L 31/113; H01L 31/119
(52) U.S. Cl. .................. 257/336; 257/335; 257/341
(58) Field of Search .................. 257/335, 336, 257/337, 341

(56) References Cited

U.S. PATENT DOCUMENTS

| 4,502,069 A | * | 2/1985 | Schuh |
| 4,754,310 A | | 6/1988 | Coe |
| 5,216,275 A | | 6/1993 | Chen |
| 6,081,009 A | * | 6/2000 | Neilson ............... 257/341 |
| 6,291,856 B1 | * | 9/2001 | Miyasaka et al. ....... 257/335 |

FOREIGN PATENT DOCUMENTS

DE 198 40 032 C1 11/1999

\* cited by examiner

*Primary Examiner*—Ngân V. Ngô
(74) *Attorney, Agent, or Firm*—Laurence A. Greenberg; Werner H. Stemer; Gregory L. Mayback

(57) ABSTRACT

The compensation component is formed with compensation regions in a semiconductor between two electrodes. By varying the second field and/or the first field, a location of a maximum field strength is displaced into the center of the compensation regions between the electrodes.

13 Claims, 3 Drawing Sheets

COMPENSATION COMPONENT WITH IMPROVED ROBUSTNESS

BACKGROUND OF THE INVENTION

Field of the Invention

The invention lies in the semiconductor technology field. More specifically, the present invention relates to a compensation component having a semiconductor body with a reverse-biasing pn junction, a first zone of a first conductivity type, which is connected to a first electrode and adjoins a zone of a second conductivity type, opposite to the first conductivity type, forming the reverse-biasing pn junction, and having a second zone of the first conductivity type, which is connected to a second electrode, that side of the zone of the second conductivity type which faces the second zone forming a first surface and, in the area between the first surface and a second surface, which lies between the first surface and the second zone, regions of the first and second conductivity type being interleaved with one another.

Such compensation components are, for example, n-channel or p-channel MOS field effect transistors, diodes, thyristors, GTOs or else other components. However, in the following text, the exemplary embodiment will be a field effect transistor (also referred to in brief as "transistor").

In relation to compensation components, there have been various theoretical investigations scattered over a long time period (see, for example, U.S. Pat. Nos. 4,754,310 and 5,216,275), in which, however, the objective is specific improvements in the turn-on resistance RSDon and not the stability under current loading, such as, in particular, robustness with regard to avalanche and short circuit in the high-current case with a high source-drain voltage.

Compensation components are based on the mutual compensation of the charging of n-doped and p-doped regions in the drift region of the transistor. The regions are in this case arranged spatially in such a way that the line integral over the doping along a line running vertically to the pn junction in each case remains below the material-specific breakdown charge (for silicon: about $2 \cdot 10^{12}$ charge carriers $cm^{-2}$). In this case, the breakdown charge is linked to the breakdown voltage via the second Maxwell equation.

For example, in a vertical transistor, as is common in power electronics, p-columns and n-columns or plates and so on are arranged in pairs. In the case of a lateral structure, p-conductive and n-conductive layers can be stacked alternately one above another laterally between a trench occupied by a p-conductive layer and a trench occupied by an n-conductive layer (see, U.S. Pat. No. 4,754,310).

As a result of the far-reaching compensation of the p-doping and n-doping, in compensation components the doping of the current-carrying area can be increased considerably, that is to say the n-conducting area for n-channel resistors and the p-conducting area for p-channel resistors, which, in spite of the loss in current-carrying area, results in a considerable gain in the turn-on resistance RDSon. The reverse-biasing ability of the transistor in this case depends substantially on the difference between the two dopings since, for reasons relating to the reduction in the turn-on resistance, a doping of the current-carrying area which is higher by at least one order of magnitude is desirable, managing the reverse voltage requires the controlled setting of the degree of compensation in the range $\leq +/-10\%$. In the case of a higher gain in turn-on resistance, the aforementioned range becomes still smaller. The degree of compensation can thereby be defined by (p-doping−n-doping)/n-doping or by charge difference/charge of a doping region. However, other definitions are also possible in this context.

In order, then, to provide a robust compensation component of the type mentioned at the beginning which, firstly, is distinguished by a high avalanche resistance and high current-carrying ability before or during breakdown and, secondly, can be produced in a straightforward way with easily reproducible characteristics with regard to the technological range of fluctuation of manufacturing processes, the earlier, commonly assigned German patent DE 198 40 032 C1 provides for the regions of the first and of the second conductivity type in such a compensation component to be doped in such a way that, in areas close to the first surface, charge carriers of the second conductivity type predominate and, in regions close to the second surface, charge carriers of the first conductivity type predominate.

In the case of a compensation component, in the reverse-bias case, the voltage is sustained by p-conductive regions and n-conductive regions located close to one another depleting one another, that is to say the charge carriers of the one region, for example the n-conductive region, electrically "compensate" for the charges in the adjacent p-conductive region. As a result, a zone which is depleted of free charge carriers is formed, that is to say a space charge zone. At small voltages, this has the effect, in the individual planes, of a Predominately horizontally oriented electrical field $E_h$, which runs at right angles to the connecting direction between the two electrodes. As the voltage increases, an increasing part of the volume of the component is depleted horizontally in this way. Once this horizontally oriented electric field $E_h$ has ultimately reached a maximum at a field strength $E_{h,Bub}$, then during any further increase in the voltage across the electrodes, the depletion begins of the semiconductor body or substrate and of the zone forming the reverse-biasing pn junction. A vertical field E is therefore then built up.

An electrical breakdown occurs at a critical field strength Ec when the vertical field assumes a value $E_{Bv}$, for which it is true that:

$$E_c = |\vec{E}_{Bv} + E_{h,Bub}| \Rightarrow E_{Bv} = \sqrt{E_c^2 - E_{h,Bub}^2}$$

With appropriate dimensions of individual cells in a compensation component, the horizontal field $E_{h,Bub}$ assumes only relatively low values, even with high doping levels of the regions of the first and second conductivity type, that is to say "high column doping levels", which leads to a low turn-on resistance RDSon, so that the field $E_{Bv}$ is of the order of magnitude of $E_c$. According to the relationship which results from this $$U_B(E_{Bv};E_{h,Bub}) = U_{Bv}(E_{Bv}) + U_{h,Bub}(E_{h,Bub})$$

it is therefore possible for a compensation component designed in this way to bias high voltages in reverse in spite of a low turn-on resistance RSDon. In this case, $U_B$ designates the breakdown voltage, $U_{Bv}$ the vertical breakdown voltage and $U_{h,Bub}$ the horizontal breakdown voltage.

In the case of power components, a large number of individual components or "cells" are connected in parallel. The requirement on a robust power component in breakdown is a high current, caused by impact ionization, without the power component being destroyed. Destruction occurs when the breakdown current in the power component is distributed only poorly, that is to say the current densities are very high at only a few locations in the semiconductor body. This is the case when only individual cells break down, that is to say if an "avalanche event" is not homogeneously distributed over the semiconductor body.

Because of inhomogeneities in the cell field which are caused by their fabrication, are to some extent only marginally pronounced and cannot be avoided, a breakdown is initially always carried by only a few cells, at low breakdown currents, this being caused, for example, by fluctuations in the doping level. These few cells therefore break down earlier than all the other cells, which leads to an inhomogeneous current distribution. The breakdown will be distributed uniformly over the semiconductor body if, for a cell, the reverse-bias voltage rises with the breakdown current, that is to say there is a positive differential characteristic curve. This is because the more current the component is to supply in total in the case of an avalanche, the more cells break down.

In the case of compensation components, the charge carriers generated at breakdown have the effect of "dynamic doping", which leads to a corresponding electrical field. This field is superimposed on the field which is generated by the dopant atoms and is referred to as a "static field profile".

Since, therefore, the breakdown characteristic of a compensation component is defined by means of the static field profile, the robustness of a compensation component, and therefore a compensation component as well, can therefore be influenced via the design of this static field profile.

One example of this is provided by the above noted German patent DE 198 40 032 C1: there, the level of compensation in the voltage-accepting volume is varied, as viewed in the vertical direction.

SUMMARY OF THE INVENTION

It is accordingly an object of the invention to provide a compensation component, which overcomes the above-mentioned disadvantages of the heretofore-known devices and methods of this general type and which is further improved with regard to an increased robustness of the compensation component.

With the foregoing and other objects in view there is provided, in accordance with the invention, a compensation component, comprising:

a semiconductor body with a reverse-biasing pn junction;

a first electrode and a second electrode on the semiconductor body;

a first zone of a first conductivity type formed in the semiconductor body and connected to the first electrode and a zone of a second conductivity type, opposite the first conductivity type, adjoining the first zone;

a second zone of the first conductivity type connected to the second electrode;

wherein the zone of the second conductivity type has a first face facing towards the second zone;

mutually interleaved regions of the first and second conductivity types formed in a region between the first face and a second face formed between the first face and the second zone; and wherein the mutually interleaved regions of the first and second conductivity types are doped such that a location, induced by the doping, of a maximum field strength of an electrical field, composed of a first field running between the first face and the second face and a second field oriented perpendicular thereto, is displaced, by varying the second field but with a free profile of the first field, into a plane defined substantially centrally between, and parallel to, the first and second faces.

In other words, in a compensation component of the type mentioned above, the objects are achieved in that the regions of the first and second conductivity type are doped in such a way that the location, induced by this doping, of the maximum field strength of the electrical field, which is composed of a first field running between the two faces and a second field oriented at right angles thereto, is displaced, by varying the second field but with a free profile of the first field, into a plane which runs substantially in the center between the two faces and parallel thereto. As a result, the voltage-sustaining volume formed by the regions of the first and second conductivity type is preferably divided by the plane into two parts which are each capable of accepting about half the breakdown voltage.

In accordance with an added feature of the invention, a voltage-accepting volume formed by the mutually interleaved regions of the first and second conductivity type is divided by the plane into two parts each capable of accepting approximately half a breakdown voltage.

The first field is preferably a vertical field, and the second field is preferably a horizontal field, so that the compensation component has a vertical structure. However, it may also be a lateral component, if the first field is a horizontal field and the second field is formed by a lateral field. In the following text, a vertical structure is to be assumed first.

In order to be able to achieve the maximum robustness of the compensation component, in the case of a vertical structure, therefore, a breakdown location PAV is displaced into a horizontal plane LH which is characterized by the fact that it breaks down the voltage-accepting volume into two parts, it being possible for about half the breakdown voltage to be accepted by each individual part.

In this case, the horizontal plane $L_H$ is preferably located at about half the height of the regions of the first and second conductivity type, that is to say of the charge columns. The further the breakdown location $P_{Av}$ is removed from the horizontal plane $L_H$ in the vertical direction, the lower the robustness of the component becomes. The breakdown location $P_{Av}$ is determined by the maximum of the electrical field strength which, for its part, is divided into a horizontal component and a vertical component.

The present invention now utilizes this subdivision of the electrical field into the horizontal field and the vertical field in an advantageous way.

In order to displace the breakdown location $P_{Av}$ into the horizontal plane $L_H$ as far as possible in the center between the first and second surfaces, there are in principle two possible ways:

(a) The horizontal field over the regions of the first and the second conductivity type, that is to say as viewed over the column depth z, is not varied, so that the breakdown location is defined via the vertical field. Here, the vertical field exhibits a global maximum in the vertical profile.

(b) The vertical field is not varied, as viewed over the column depth z, so that the breakdown location $P_{Av}$ is defined via the horizontal field. Here, the horizontal field exhibits a global maximum in the vertical profile.

By using the above possible ways (a) and (b) to configure the horizontal field and the vertical field, virtually any desired doping profiles can be specified, said profiles differing from the doping profile described in DE 198 40 032 C1, but being able to achieve the same objective, such as in particular high robustness for a compensation component.

Corresponding considerations also apply to a lateral component.

Other features which are considered as characteristic for the invention are set forth in the appended claims.

Although the invention is illustrated and described herein as embodied in a compensation component with improved robustness, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
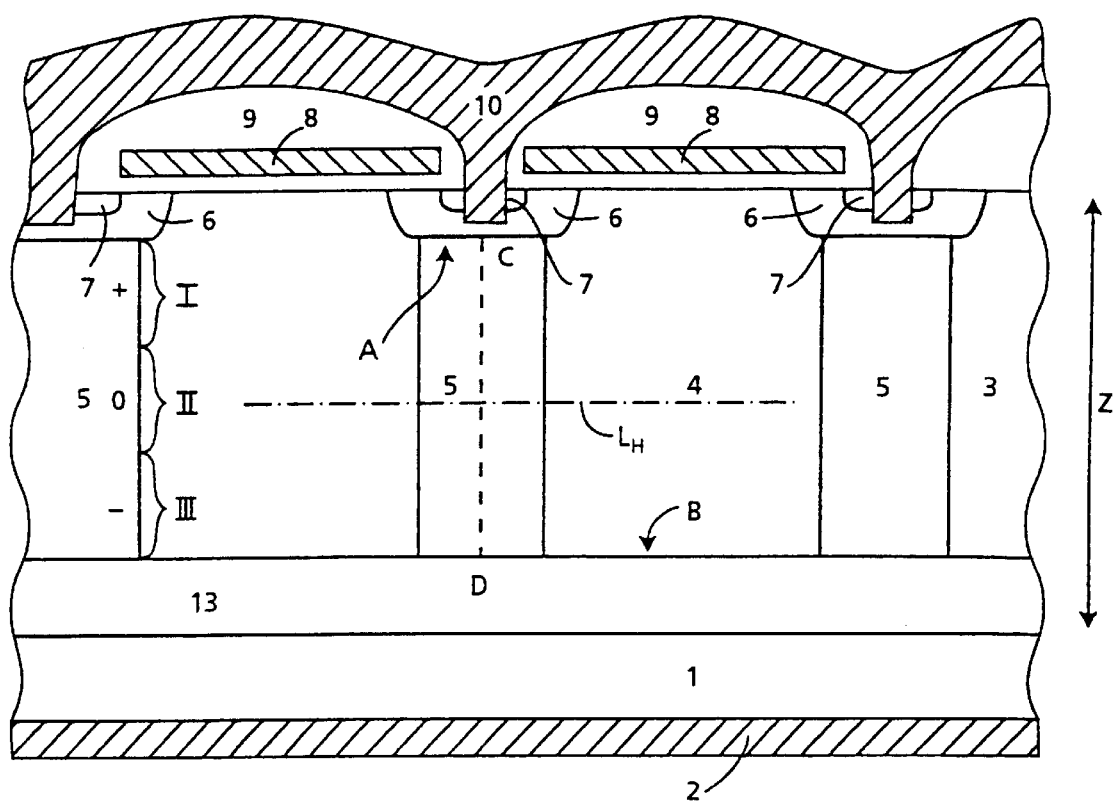
FIG. 1 shows a section through an n-channel MOS transistor as a first exemplary embodiment of the compensation component according to the invention with a vertical structure.

Referring now to the figures of the drawing in detail and first, particularly, to FIG. 1 thereof, there is seen a section through an n channel MOS transistor having an $n^+$-conductive silicon semiconductor substrate 1, a drain metallization 2, a first n-conductive layer 13, a second layer 3 with n-conductive regions 4 and p-conductive regions 5, p-conductive zones 6, n-conductive zones 7, gate electrodes 8 consisting of polycrystalline silicon or metal, for example, which are embedded in an insulating layer 9 of silicon dioxide, for example, and a source metallization 10 of aluminum, for example. The p-conductive regions 5 do not reach the n+-conductive semiconductor substrate 1.

The $n^+$-conductive substrate 1 forms a contact layer with the metallization 2, while the n-conductive layer 13 sustains voltage.

In FIG. 1, only the metallic layers are illustrated as hatched, for reasons of better clarity, although the remaining regions or zones are shown in section.

In the case of the compensation component disclosed by the above-mentioned German patent DE 198 40 032 C1, there is then an excess of p-charges in a zone I in the p-conductive regions 5, a "neutral" charge in a zone II and an excess of n-charges in a zone III.

This does not apply to the present invention. Here, instead, the doping level in the regions 4, 5 is selected in such a way that the profile of the horizontal field and/or of the vertical field is such that a breakdown occurs approximately at a location $P_{Av}$ (FIG. 4) in a plane $L_H$ which lies parallel to the surfaces A of the p-conductive zone 6 and a surface B approximately at the center between these surfaces.

Figure 2:
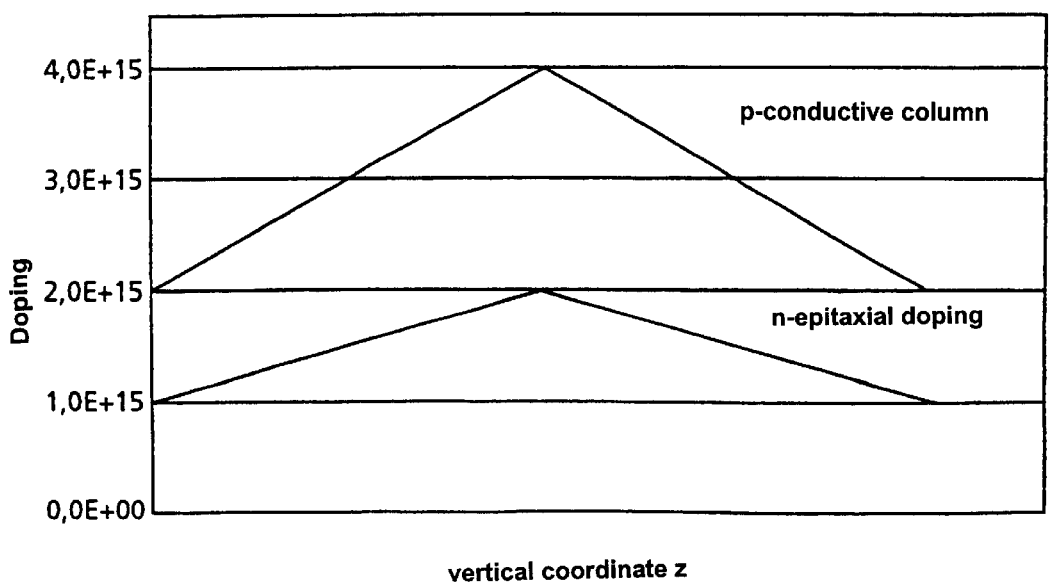
FIG. 2 shows the course of doping profiles at any desired location in the interior of a n-conductive region and a p-conductive column in the compensation component of FIG. 1.

In order to achieve this, the doping level in the regions 5, that is to say the p-column doping, as it is known, can have a profile as specified in FIG. 2. In addition, FIG. 2 also indicates a possible doping level for the n-conductive regions 4.

Figure 3:
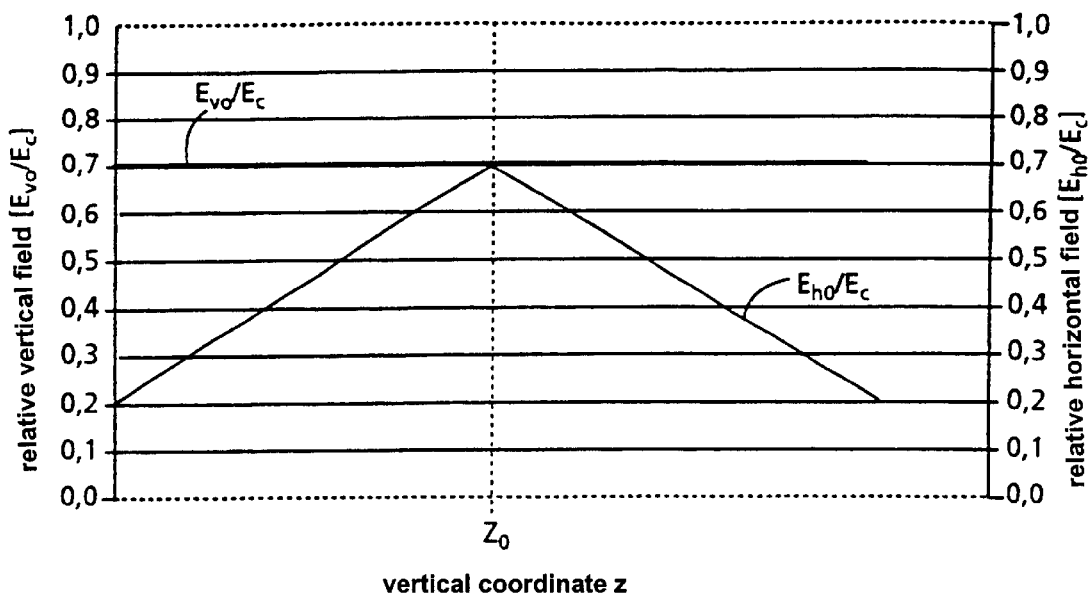
FIG. 3 shows the course of the electrical field strength in the depth of a p-conductive column in a vertical structure along a sectional straight line in which the maximum overall field strength occurs in each case.

FIG. 3 shows, for a doping level of the type shown in FIG. 2, the profile of the electrical field strength resolved over depth, specifically for the relative vertical field $E_{v0}/E_c$ and for the relative horizontal field $E_{h0}/E_c$, along a sectional straight line $(x_0, y_0, z)$ in which in each case the maximum overall field strength occurs, that is to say it shows the profile of the electrical field strength, resolved over depth, along the boundary face between the regions 4 and 5. In this way, it is possible to see from FIG. 3 that, by varying the horizontal field at a location $z_0$, which lies approximately in the center of the extent of the vertical coordinates z, a maximum electrical field can be ensured.

Figure 4:
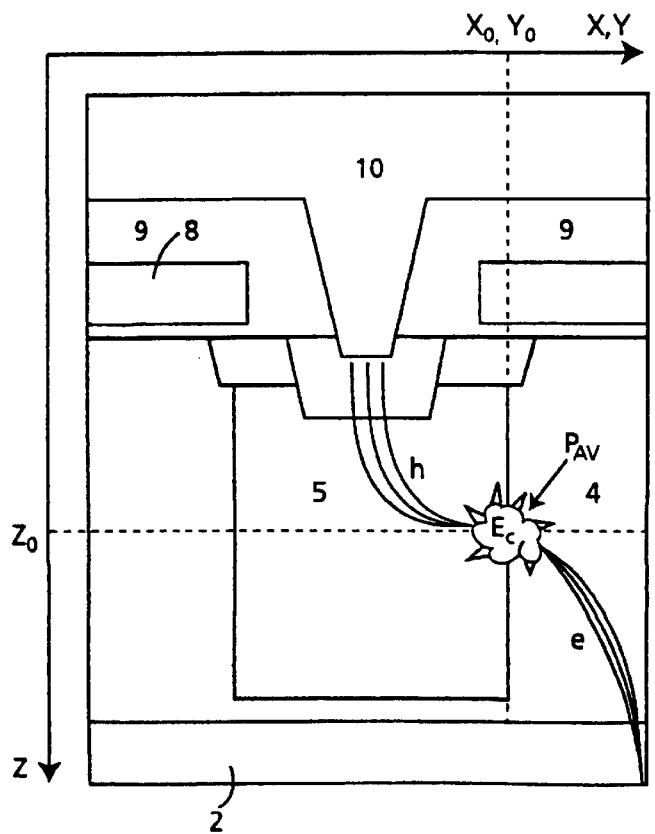
FIG. 4 shows a schematic representation of a vertical compensation component at breakdown.

In each horizontal plane, the maximum transverse field $E_{h0}$ (z) is to be found at the pn junction between the regions 4, 5, that is to say directly on the "jacket" or on the bordering face of the p-conductive, column-forming regions 5 (cf. the location $x_0$, $y_0$ in FIG. 4). The horizontal or transverse field $E_{h0}$ (z) is greater the higher the charge concentration in the regions 4, 5. This also results in the gabled or roof-like profile of the horizontal field shown in FIG. 3.

Because of intrinsic and electrical compensation in the z-planes, the vertical field can have a constant value over the entire column depth, that is to say the depth of the regions 4, 5 in the z direction.

The overall electrical field $E_0$ (z) at the location $x_0$, $y_0$ is given by the vector addition of the horizontal field $E_{h0}$ (z) and the vertical field $E_{v0}$.

In the present example, the critical field $E_c$ is exceeded at a location $P_{Av}$, at about half the height $z_0$ of the p-conductive column 5, for which reason the compensation component breaks down there.

The charge carriers generated in the breakdown at the breakdown location $P_{Av}$ are separated from one another by the high electrical field: the holes h run upward in the p-conductive region 5 in the direction towards the source, while the electrons e in the n-doped regions 4 flow to the drain terminal (cf. FIG. 4).

Figure 5:
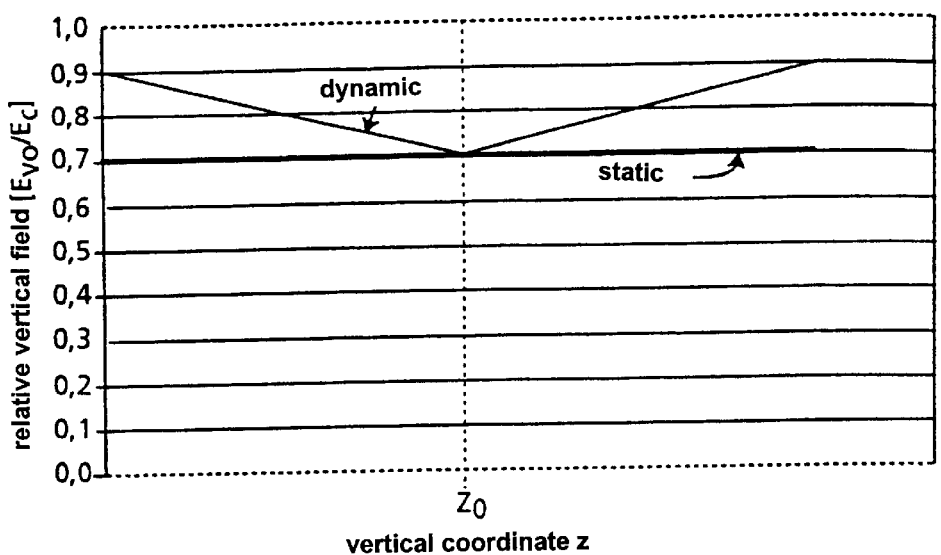
FIG. 5 shows the depth profile of a vertical field in the static state and with a "dynamic" pn junction in the case of a vertical structure.

The charge carriers generated at breakdown produce a "dynamic" p and n charge, which results in an equivalent electrical field being superimposed on the "static " field profile. The resulting vertical field is illustrated schematically in FIG. 5 in comparison with the static state.

The significant feature in the above exemplary embodiments of the present invention is the utilization of the vertical field and of the horizontal field; specifically by means of a "roof-like" profile of the horizontal field with a global maximum at the pn junction between the regions 4 and 5 and approximately in the center between the surfaces A and B, the situation in which the breakdown occurs at the center of the semiconductor body can be achieved with virtually any desired profile of the vertical field. Of course, however, it is also possible to vary the vertical field, additionally or on its own, in such a way that the desired effect for the breakdown location is achieved. It is therefore possible for the vertical field to have a substantially constant profile or a profile increasing or decreasing between the two electrodes or else a roof-like profile.

The above considerations for the exemplary embodiments of FIGS. 1 to 5, in which vertical structures are shown, apply in a corresponding way to lateral compensation components as well, but it is then necessary, by comparison with a vertical arrangement, to interchange the profile of the vertical field and of the horizontal field with each other.

Figure 6:
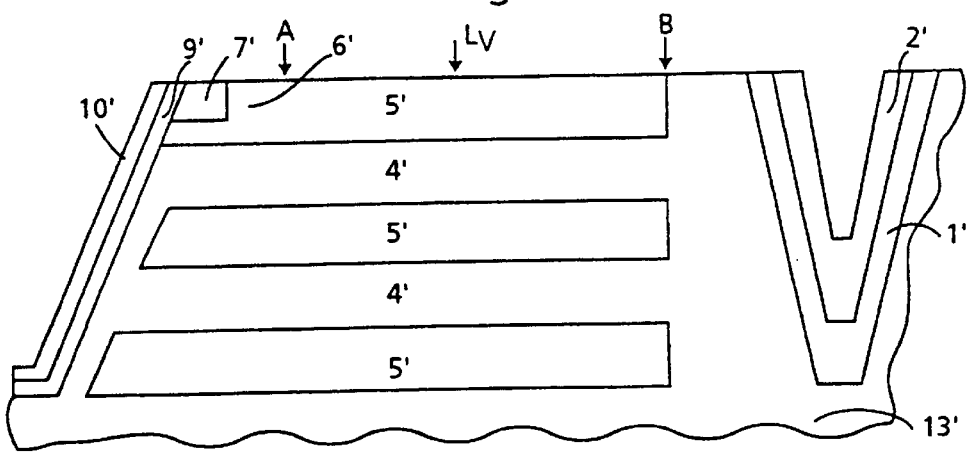
FIGS. 6 and 7 show a schematic sectional representation and a plan view, respectively, of a compensation component according to the invention with a lateral structure.
Figure 7:
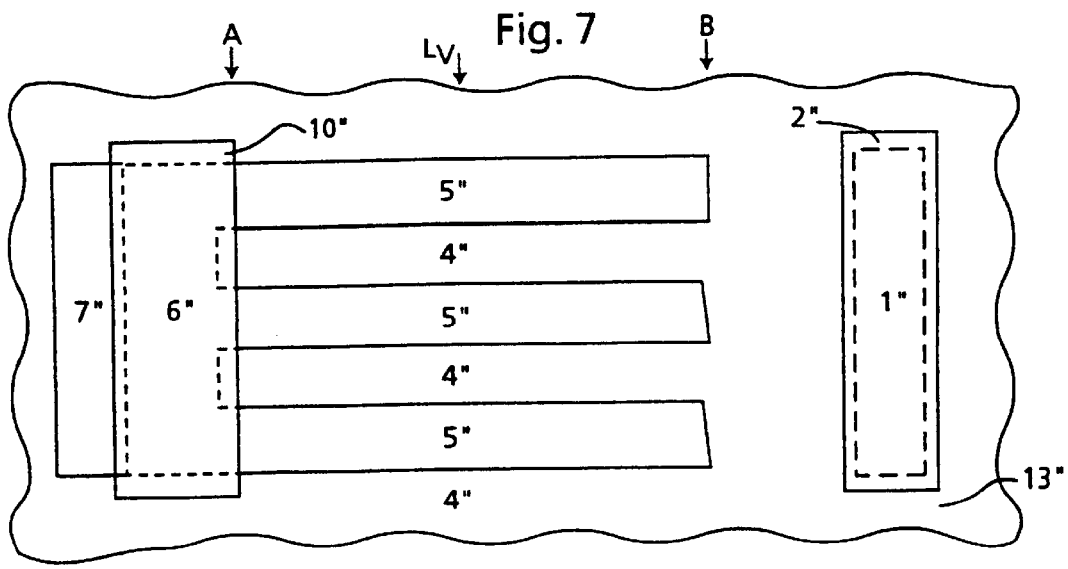

FIGS. 6 and 7 show two exemplary embodiments of such lateral compensation components, in the exemplary embodiment of FIG. 6 the regions of the first and second conductivity type being located alternately over and under one another and, in the exemplary embodiment of FIG. 7, these regions being provided alternately beside one another.

In FIGS. 6 and 7, mutually corresponding components are provided with the same reference symbols as in FIGS. 1 and 4, but supplemented by a single prime (FIG. 6) or double prime (FIG. 7).

In the exemplary embodiment of FIG. 6, therefore, a layer 1' deposited epitaxially in a V-shaped trench corresponds to the substrate 1 of FIG. 1, a silicon semiconductor body 13' corresponds to the voltage-accepting layer 13, a gate-oxide layer 9' in a further trench corresponds to the insulating layer 9 of silicon dioxide, an n-conductive zone 7' corresponds to the n-conductive zone 7, and so on.

The face A, which is indicated schematically here by an arrow, runs approximately at the end of the p-conductive zone 6', which merges into a p-conductive region 5'. The face B runs in the direction of the arrow at the end of the regions 5'. Accordingly, a vertical plane $L_V$ corresponding to the horizontal plane $L_H$ lies approximately in the center between the faces A and B.

Corresponding considerations apply to the exemplary embodiment of FIG. 7.

In the exemplary embodiments of FIGS. 6 and 7, as in the exemplary embodiments of FIGS. 1 to 5, the vertical field and the horizontal field are utilized in such a way that there is a "roof-like" profile of the vertical field with a global maximum at the pn junction between the regions 4' and 5' and 4" and 5", respectively, and approximately in the center between the faces A and B, while the horizontal field can assume virtually any desired profile. This achieves the situation where the breakdown occurs in the center of the semiconductor body between the two electrodes 2' and 10' and 2" and 10", respectively, in the area of the vertical plane $L_V$. Of course, however, it is also possible here to vary the horizontal field, additionally or on its own, in such a way that the desired effect for the breakdown location is achieved. The horizontal field can therefore have a substantially constant profile or a profile increasing or decreasing between the two electrodes or else a roof-like profile.

We claim:

1. A compensation component, comprising:

a semiconductor body;

a first electrode and a second electrode on said semiconductor body;

a first zone of a first conductivity type formed in said semiconductor body and connected to said first electrode and a zone of a second conductivity type, opposite the first conductivity type, adjoining said first zone;

a second zone of the first conductivity type connected to said second electrode;

wherein said zone of the second conductivity type has a first face facing towards said second zone;

mutually interleaved regions of the first and second conductivity types formed in a region between said first face and a second face formed between said first face and said second zone; and said mutually interleaved regions of the first and second conductivity types are doped such that a location, induced by the doping, of a maximum field strength of an electrical field, composed of a first field running between said first face and said second face and a second field oriented perpendicular thereto, is displaced, solely by varying the second field while keeping the first field constant, into a plane defined substantially centrally between, and parallel to, said first and second faces.

2. The compensation component according to claim 1, wherein a voltage-sustaining volume formed by said mutually inter-leaved regions of the first and second conductivity type is divided by the plane into two parts each capable of accepting approximately half a breakdown voltage.

3. The compensation component according to claim 1, wherein the first field has a substantially constant profile.

4. The compensation component according to claim 1, wherein the first field has a profile increasing from said first electrode to said second electrode.

5. The compensation component according to claim 1, wherein the first field has a profile decreasing from said first electrode to said second electrode.

6. The compensation component according to claim 1, wherein the first field between said first electrode and the second electrode has a roof-like profile.

7. The compensation component according to claim 1, wherein the second field has a roof-like profile with a maximum at the pn junction between said mutually interleaved regions of the first and second conductivity types.

8. The compensation component according to claim 1, wherein the location of maximum field strength is defined at a pn junction formed between said mutually interleaved regions of the first and second conductivity types.

9. The compensation component according to claim 1, wherein the first field is a vertical field and the second field is a horizontal field, defining the compensation component as a vertical component.

10. The compensation component according to claim 1, wherein the first field is a horizontal field and the second field is a vertical field, defining the compensation component as a lateral component.

11. The compensation component according to claim 10, wherein the mutually interleaved regions of the first and second conductivity types are located alternately one above another.

12. The compensation component according to claim 10, wherein the mutually interleaved regions of the first and second conductivity types are located alternately beside one another.

13. The compensation component according to claim 1, wherein the first field is not varied, so that a breakdown location is defined solely by the second field.

* * * * *